United States Patent [19]
Wichern

[11] Patent Number: 5,648,741
[45] Date of Patent: Jul. 15, 1997

[54] CIRCUIT HAVING OVERALL TRANSFER FUNCTION PROVIDING TEMPERATURE COMPENSATION

[75] Inventor: Andreas Wichern, Hamburg, Germany

[73] Assignee: U.S. Philips Corporation, New York, N.Y.

[21] Appl. No.: 435,056

[22] Filed: May 8, 1995

[30] Foreign Application Priority Data

May 13, 1994 [DE] Germany ..................... 44 16 981.7

[51] Int. Cl.$^6$ ..................................... H03F 3/45
[52] U.S. Cl. ..................... 327/513; 327/362; 327/563; 330/256
[58] Field of Search ................... 327/512, 513, 327/563, 561, 361, 359, 356, 83, 55, 52, 362, 560; 377/25; 330/256, 252, 261, 289

[56] References Cited

U.S. PATENT DOCUMENTS

| | | | |
|---|---|---|---|
| 3,812,434 | 5/1974 | Lommers et al. | 330/252 |
| 3,895,224 | 7/1975 | Spratt et al. | 327/334 |
| 4,230,953 | 10/1980 | Wilcox | 327/518 |
| 4,965,528 | 10/1990 | Okanobu | 330/252 |
| 5,025,231 | 6/1991 | Schwartzbach | 331/116 |
| 5,130,572 | 7/1992 | Stitt et al. | 327/96 |
| 5,319,267 | 6/1994 | Kimura | 327/105 |
| 5,420,538 | 5/1995 | Brown | 330/252 |
| 5,461,430 | 10/1995 | Hagerman | 348/674 |
| 5,471,173 | 11/1995 | Moore et al. | 327/350 |
| 5,500,623 | 3/1996 | Kimura | 330/253 |

FOREIGN PATENT DOCUMENTS

| | | | |
|---|---|---|---|
| 0401919 | 12/1990 | European Pat. Off. | H03L 1/02 |
| 3008686 | 9/1980 | Germany | H03B 5/04 |
| 3027071 | 2/1982 | Germany | H03F 3/45 |
| 3027071 | 11/1982 | Germany . | |

Primary Examiner—Timothy P. Callahan
Assistant Examiner—Terry L. Englund
Attorney, Agent, or Firm—Bernard Franzblau

[57] ABSTRACT

A circuit arrangement having an input arranged to receive an input signal (U20) and an output for providing an output signal (U22). The circuit has an overall transfer function defined as the ratio between the output signal and the input signal and which is obtained by adding individual transfer functions of at least two different amplifiers with different slopes in their linear ranges and/or different limit values in their saturation ranges and/or different zero points alternately with positive and negative signs in a manner such that, at least partly, it corresponds substantially to a function of at least the third degree. This circuit arrangement generates, in a simple manner, an overall transfer function of at least the third degree, which can be used advantageously, for example, for the compensation of the temperature-verses-resonant-frequency characteristic function of a quartz crystal.

22 Claims, 5 Drawing Sheets

CIRCUIT HAVING OVERALL TRANSFER FUNCTION PROVIDING TEMPERATURE COMPENSATION

BACKGROUND OF THE INVENTION

This invention relates to a circuit arrangement having a given predetermined overall transfer function, which is defined as the ratio between an output signal which can be taken from an output and an input signal which can be applied to an input.

The article "CAD Simplifies TCXO Design" by Paul Faerber and Alan Victor in "Oscillator Design Handbook" describes a network which can provide compensation for the resonant frequency of a quartz crystal, which is a non-linear function of the temperature. For this purpose an input voltage $V_i$ is converted into a temperature-dependent voltage $V_o$ via said network, which voltage is applied to a varactor diode as a control voltage. This varactor diode is arranged in series with the quartz crystal and enables the resonant frequency of the entire arrangement comprising the varactor diode and the quartz crystal to be adjusted via the input voltage $V_i$. For the temperature compensation of the quartz crystal the network comprises a plurality of thermistors to permit compensation for the non-linear temperature-versus-resonant-frequency characteristic function of the quartz crystal. Such a network generally requires certain combinations of parts with positive and negative reactive temperature coefficients. In an example given in said article three thermistors with negative temperature coefficients are required in a special combination with further resistors. From said article it is further apparent that such a network can only partly compensate for the temperature-versus-resonant-frequency characteristic function of the quartz crystal.

However, the prior-art circuit arrangements have the drawback that they provide only very inadequate compensation with a highly complex circuit. This high complexity is caused by the fact that the various thermistors to be used cannot be integrated and that adjustment of the resulting network is difficult and complicated. This prohibits a low-cost production of compact temperature-compensated oscillators.

Another temperature-compensation possibility for a quartz crystal is to apply a voltage generated by a digital-to-analog converter to the varactor diode (variable capacitance diode), the input signals for the converter being supplied by a memory. This memory can store a given data sequence for each temperature in order to compensate for the temperature dependence of the quartz crystal by means of the digital-to-analog converter. For this purpose, the memory should be read out in dependence on the temperature of the quartz crystal. Although such a solution in principle enables integration on a semiconductor body and can therefore result in a relatively compact construction, it requires an intricate circuit, particularly if a subsequent adjustment of the temperature dependence is needed.

SUMMARY OF THE INVENTION

Therefore, it is an object of the invention to provide a circuit arrangement which, in a simple way, makes it possible to derive an overall transfer function by means of which, for example, the temperature dependence of a quartz crystal can be compensated with very simple and compact means, but which can also be used for general purposes.

According to the invention this object is achieved by means of a circuit arrangement having an input, arranged to receive an input signal, an output for providing an output signal, and an overall transfer function defined as the ratio between the output signal and the input signal and obtained by adding individual transfer functions of at least two differential amplifiers with different slopes in their linear ranges and/or different limit values in their saturation ranges and/or different zero points alternately with positive and negative signs in such a manner that at least partly said overall transfer function corresponds at least substantially to a function of at least the third degree.

The invention is based on the recognition of the fact that a significant simplification can be achieved in that in said prior-art example a compensation for a non-linear characteristic is effected in that a measurement quantity, in the present case the temperature, is acquired in an essentially linear fashion and an output signal having a non-linear relationship, corresponding to the desired compensation, with the measurement quantity is derived electrically or electronically from this single acquisition of the measurement quantity. The invention thus provides a substantially more compact and simpler way to realise a solution to the problem than the afore-mentioned possibility using a memory and a digital-to-analog converter.

The invention is further based on the recognition that the temperature-versus-resonant-frequency characteristic function of a quartz crystal in the relevant temperature range corresponds at least substantially to a third-degree function, i.e. a cubic function, which means that the resonant frequency varies with the third power of the temperature. In accordance with the invention the temperature dependence of such a quartz crystal is then compensated by means of a circuit arrangement whose overall transfer function also corresponds to a third-degree function, which is dimensioned in such a manner that an input signal of the circuit arrangement, which input signal has a basically linear temperature dependence, is converted into an output signal by means of which variations of the resonant frequency of the quartz crystal as a function of the temperature can be compensated, for example, via a varactor diode.

In addition, the invention also provides a circuit arrangement having an overall transfer function of a higher degree, i.e. a dependence of the output signal on higher powers of the input signal than the third power. This also enables more complex overall transfer functions to be generated in a simple manner, for example, for the compensation of more complicated temperature dependencies but also for a wide variety of other purposes.

The individual transfer functions of the individual differential amplifiers, combined in accordance with the invention, can be generated by very simple means because they correspond to the customary characteristics of, for example, simple transistor differential amplifiers. Such individual transfer functions, i.e. differential amplifier characteristics, exhibit an at least substantially linear relationship between the applied difference voltages and the output voltages of the differential amplifiers for small difference voltages at their inputs. These portions of the characteristics are referred to herein as linear ranges.

For larger difference voltages applied to such a differential amplifier the voltages supplied by the differential amplifier reach values which no longer increase when the applied difference voltage is further increased. Herein, these values are referred to as limit values, the corresponding ranges of the applied difference voltages are referred to as saturation ranges, and the points of the individual transfer functions of the differential amplifiers which correspond to an applied difference voltage of zero are referred to as zero points. For said differential amplifiers these zero points can be defined by means of reference voltages or currents to be applied to at least one of their inputs.

Preferably, the individual transfer functions can be combined with alternately positive and negative signs to form the overall transfer function in that an input signal is applied to all of the differential amplifiers with the same polarity, whereas the output signals of the individual differential amplifier are added to one another alternately with the same and with opposite polarity. Starting with a first individual transfer function it is then possible to proceed continually in a manner such that a second individual transfer function is combined with the first one with an opposite sign, the second individual transfer function being modified relative to the first one by changing the slope, limit values and/or the zero point, in such a manner that each time that an additional individual transfer function is added this produces two additional inflection points in the resulting overall transfer function.

Therefore, in a preferred embodiment of the circuit arrangement in accordance with the invention, the overall transfer function is formed by the addition of individual transfer functions of at least two differential amplifiers with different slopes in their linear ranges and with limit values in their saturation ranges, which limit values increase monotonically in the sequence of decreasing slopes. The individual transfer functions are added alternately with positive and negative signs in the same sequence.

This simplified overall transfer function can also be built up in successive steps. A first individual transfer function having the larger slope and the smallest limit values with a positive sign is added to a second individual transfer function having a slope reduced by a given amount but larger limit values with a negative sign. The zero points of the individual transfer functions are then preferably identical. This already yields an overall transfer function having two additional inflection points as compared with an individual transfer function of a simple differential amplifier. In a range around its zero point and the adjacent inflection points this overall transfer function at least substantially corresponds to a third-degree function.

By now adding with a positive sign a third individual transfer function with a corresponding zero point but a further reduced slope and larger limit values as compared with the second individual transfer function two further inflection points are obtained in the overall transfer function, so that at least in the area of the zero point and all the inflection points obtained the overall transfer function at least substantially corresponds to a function of correspondingly higher degree.

This overall transfer function may be combined with further individual transfer functions with further reduced slopes and further increased limit values, i.e. limit values which increase monotonically in the sequence of decreasing slopes, alternately with positive and negative signs in the same sequence, each further individual transfer function yielding two new inflection points.

In another embodiment of the circuit arrangement in accordance with the invention, by the overall transfer function is formed by addition of individual transfer functions of at least three differential amplifiers with different zero points alternately with positive and negative signs in the sequence of the zero points. This embodiment represents another advantageous simplification of the general teaching of the invention, which preferably uses individual transfer functions with corresponding slopes and limit values. Again, it is possible to start from a first individual transfer function having a first zero point which is combined with opposite sign with a second individual transfer function having a second zero point, which is shifted towards larger values relative to the first zero point. This yields a function with a maximum which for the explanation of the present invention may also be referred to as a first inflection point. Subsequently, a third individual transfer function of a third differential amplifier is then added with opposite sign in comparison with the second individual transfer function and with the zero point again shifted in the same direction relative to the second zero point of the second individual transfer function, which results in a further inflection point (for example, a minimum). This yields an at least substantially cubic overall transfer function, which can also be expanded very simply into a function of a higher degree in that further individual transfer functions are added with the correct sign.

Both in its most general form and in special embodiments the invention has the advantage that the circuit arrangement it provides can simply form a device for the generation of third or higher degree overall transfer functions, which device is easily adjustable and, above all, readily integratable on a semiconductor body. This overall transfer function can easily be adapted to the widest variety of characteristics and specifications by modifying the slopes, limit values and/or zero points. For example, when used for the compensation of the temperature-versus-resonant-frequency characteristic function of a quartz crystal the circuit arrangement in accordance with the invention can thus be adapted simply and accurately to the given specifications of the quartz crystal, so that it is also possible to compensate for the temperature dependence of quartz crystals with greatly differing characteristic functions. If, for example, the individual or all of the slopes, limit values and/or zero points of the differential amplifiers which are used are made adjustable, preferably by means of adjustable reference voltages or currents, it will also be easy to subsequently adapt or adjust a ready-dimensioned circuit arrangement in accordance with the invention to different desired overall transfer functions.

In another embodiment of the circuit arrangement in accordance with the invention, in which the overall transfer function is at least partly a function of at least substantially the third degree and which is used for the compensation of the temperature dependence of a quartz crystal in a manner already mentioned, this circuit arrangement is combined with, in addition, a quartz crystal having a temperature-versus-resonant-frequency characteristic function of a quartz crystal in the relevant temperature range, which function at least partly corresponds to a function of at least substantially the third degree, a correction element for correcting the resonant frequency by a correction signal with an at least substantially linear transfer characteristic between the correction signal and the resonant frequency, a measuring element for forming a measurement signal whose value has an at least substantially linear dependence on the temperature of the quartz crystal, the measurement signal being applicable to the circuit arrangement as an input signal, which arrangement applies the output signal, derived from said input signal in accordance with the overall transfer function, to the correction element as the correction signal in such manner that the resonant frequency of the quartz crystal coupled to the correction element is at least substantially temperature independent in said range.

Such an embodiment of the circuit arrangemet in accordance with the invention in conjunction with the devices further mentioned forms a preferred use of the circuit arrangement in accordance with the invention, but its use is not limited thereto. On the contrary, it is also possible to form other overall transfer functions of a higher degree for the compensation of other temperature dependencies but, in general, also for the generation of given functional relationships. Particularly in the case of the conversion of non-electrical variables into electric signals and the processing of these signals, this has the advantage that the conversion of the non-electrical variables is possible by means of simple, particularly linear, arrangements.

Another advantageous embodiment of the circuit arrangement in accordance with the invention is characterised in that the differential amplifiers used therein each comprise a transistor pair whose emitter terminals are coupled v/a at least one emitter resistor, the slopes of the individual transfer functions of the differential amplifiers in their linear ranges being adjustable by an appropriate choice of the resistance values of the emitter resistors.

This construction of the differential amplifiers for the linearisation of their individual transfer functions forms a simple and reliable solution. However, in the ease of high resistance values the emitter resistors needed for this may require an undesirably large area on a semiconductor body on which they are to be integrated. Alternatively, a linearisation, i.e. a reduction of the slopes of the individual transfer functions of the differential amplifiers, is possible without the use of emitter resistors in the circuit arrangement in accordance with the invention in that the differential amplifiers used therein each comprise a first and a second pair of first and second emitter-coupled bipolar planar transistors, the base and the collector terminal of the first transistors of the first pair being coupled to the corresponding terminal of the first transistor of the second pair and the base and the collector terminal of the second transistor of the first pair being coupled to the corresponding terminal of the second transistor of the second pair, and the emitter areas of the second transistor of the first pair and the first transistor of the second pair being equal to one another and being a given factor larger or smaller than the mutually equal emitter areas of the two other transistors.

Here, it is to be noted that from DE-OS 30 27 071 it is known to provide a transistor amplifier with a first transistor pair comprising a first and a second transistor and with a second transistor pair comprising a third and a fourth transistor, the emitter electrodes of the transistors of each pair being interconnected. The base and collector of the first transistor are coupled to the corresponding electrodes of the third transistor and the base and collector of the second transistor to the corresponding electrodes of the fourth transistor. The bases of the first and the third transistor are connected to one terminal and the bases of the second and the fourth transistor are connected to the other terminal of a signal source and the output signal can be derived from the collector currents of the transistors. The common emitter lines of both transistor pairs include corresponding current sources and the transistors are dimensioned in such a manner that the emitter areas of the second and the third transistor are equal to one another and are a given factor larger or smaller than the mutually equal emitter areas of the first and the fourth transistor. As a result, the collector direct currents through the first and the fourth transistor are equal to one another and larger or smaller by said factor than the mutually equal collector direct currents through the second and the third transistor. By means of this known arrangement it is possible to reduce non-linear distortions in a differential amplifier formed by a simple transistor pair, i.e. to linearise the characteristic of this amplifier, which reduces the slope of this characteristic in the area around its zero point. Such a circuit arrangement does not require the use of emitter resistors and under given conditions it can even be more compact than the differential amplifier with emitter resistors described above.

BRIEF DESCRIPTION OF THE DRAWINGS

Some embodiments of the invention will now be described in more detail, by way of example, with reference to the accompanying drawings. In the drawings.

DESCRIPTION OF THE PREFERRED EMBODIMENT

Figure 1:
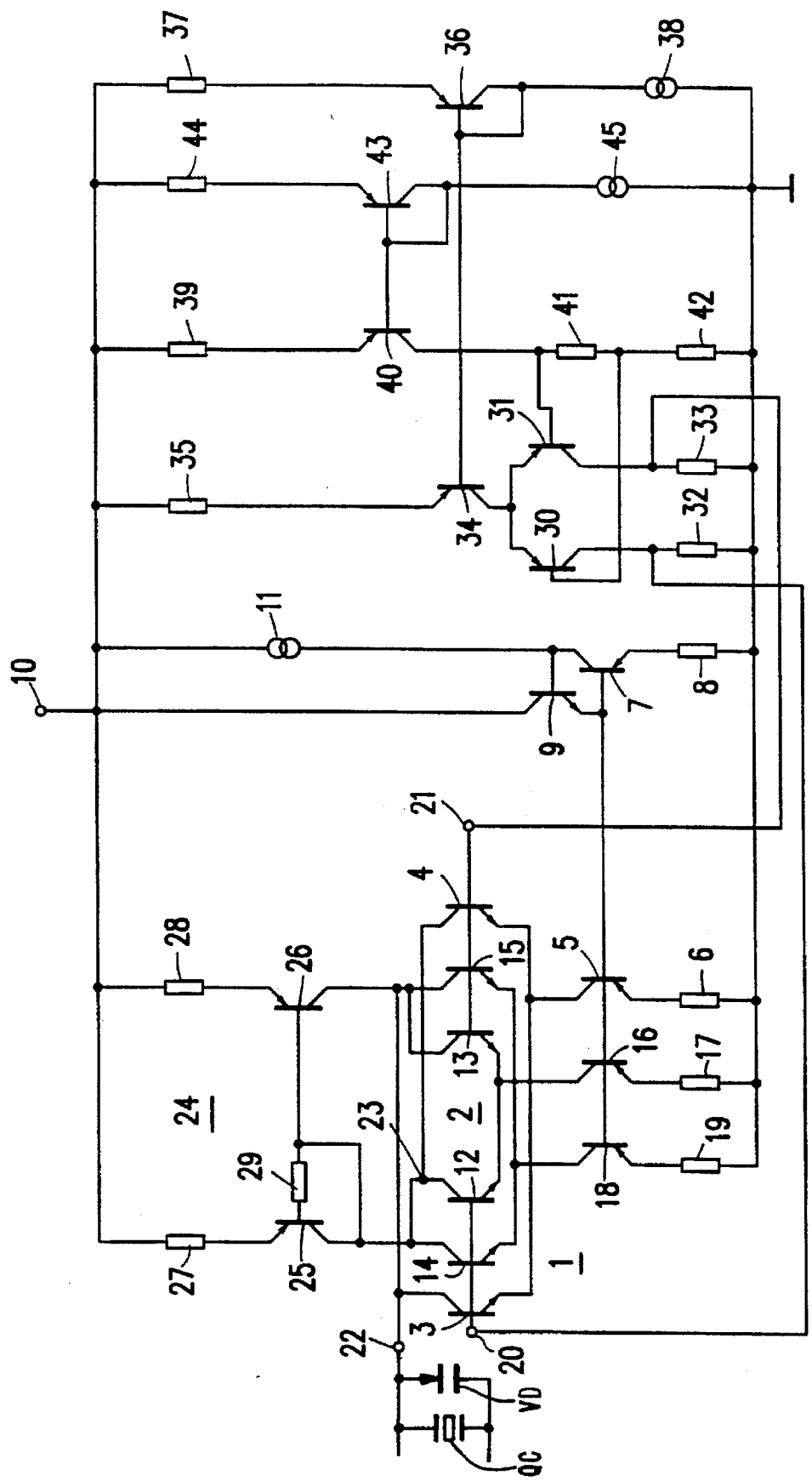
FIG. 1 shows a first embodiment of a circuit arrangement in accordance with the invention in combination with a measuring element.

The circuit arrangement shown in FIG. 1 comprises a non-linearised first differential amplifier 1 and a linearised second differential amplifier 2. In the linear range of its individual transfer function the first differential amplifier 1 has a greater slope than the second differential amplifier 2, for which purpose the individual transfer function of the second differential amplifier has two higher limit values in its saturation ranges than the individual transfer function of the first differential amplifier. In the present case both differential amplifiers 1, 2 have corresponding zero points.

The first differential amplifier 1 comprises a pair of emitter-coupled transistors 3, 4 whose emitter terminals are together connected to a collector terminal of a first current-source transistor 5. An emitter terminal of the first current-source transistor 5 is connected to ground via a first resistor 6.

The first current-source transistor 5 has its base terminal connected to the base terminal of a first supply transistor 7, which has its emitter terminal also connected to ground via a first supply resistor 8. A further transistor 9 has its emitter terminal connected to the interconnected base terminals of the first current-source transistor 5 and the first supply transistor 7, its base terminal being connected to the collector terminal of the first supply transistor 7 and its collector terminal to a supply voltage terminal 10. The connection between the base terminal of the further transistor 9 and the collector terminal of the first supply transistor 7 is also connected to the supply voltage terminal 10 via a first constant-current source 11. The first current-source transistor 5, the first supply transistor 7, the further transistor 9, the resistors 6, 8 and the first constant-current source 11 cooperate as a current-mirror arrangement which impresses an emitter direct current, determined by the first constant-current source 11, upon the pair of emitter-coupled transistors 3, 4.

The linearised second differential amplifier 2 comprises a first pair of emitter-coupled transistors 12, 13 which, like all the other transistors shown in FIG. 1, are suitably constructed as bipolar planar transistors. The interconnected emitter terminals of the transistors 12, 13 of this first pair of the second differential amplifier 2 are connected to the collector terminal of a second current-source transistor 16, whose emitter terminal is coupled to ground via a second resistor 17 and whose base terminal is connected to the base terminal of the first current-source transistor 5. Moreover, the second differential amplifier 2 comprises a second pair of emitter-coupled transistors 14, 15 whose interconnected emitter terminals are connected to the collector terminal of a third current-source transistor 18, which has its emitter terminal coupled to ground via a third resistor 19 and which has its base terminal connected to the base terminal of the first current-source transistor 5. In this way the emitter direct currents of the differential amplifiers 1, 2 are furnished jointly via the first constant-current source 11.

The base terminals of each first transistor 3, 12, 14 of the pairs of emitter-coupled transistors in the differential amplifiers 1, 2 are interconnected and form a first input terminal 20 of the circuit arrangement including the two differential amplifiers 1, 2, which at least partly has an overall transfer function of at least substantially the third degree. Likewise, the base terminals of all second transistors 4, 13, 15 of the pairs of emitter-coupled transistors of the differential amplifiers 1, 2 are connected to a second input terminal 21 of said circuit arrangement. Furthermore, the collector terminals of the first transistor 3 of the first differential amplifier 1 and of the second transistors 13, 15 of the pair of emitter-coupled transistors belonging to the second differential amplifier 2 are together connected to an output terminal 22 at which an output signal of the circuit arrangement 1, 2 is available, which signal exhibits said third-degree dependence on an input signal applied to one of the input terminals 20, 21. The collector terminals of the second transistor 4 of the first differential amplifier 1 and the first transistors 12, 14 of both pairs of emitter-coupled transistors of the second differential amplifier 2 are interconnected in a first node 23. The first node 23 forms an input terminal of a current mirror 24 comprising a first and a second current-mirror transistor 25 and 26, respectively. The emitter terminals of the first and the second current-mirror transistors 25 and 26 are connected to the supply voltage terminal 10 via a first and a second current-mirror resistor 27 and 28, respectively. The first node 23, i.e. the input of the current mirror 24, is connected directly to the base terminal of the second current-mirror transistor 26 and to the base terminal of the first current-mirror transistor 25 via a third current-mirror resistor 29. The collector terminal of the second current-mirror transistor 26 is connected to the output terminal 22.

Whereas the first differential amplifier has a non-linearised individual transfer function, the slope of this function of the second differential amplifier 2 in the linear range has been reduced in comparison with that of the first differential amplifier 1 in that the emitter areas of the second transistor 13 of the first pair of emitter-coupled transistors in the second differential amplifier 2 and the first transistor 14 of the second pair are equal to one another and are a given factor smaller than the mutually equal emitter areas of the two other transistors, i.e. of the first transistor 12 of the first pair and of the second transistor 15 of the second pair. In a preferred embodiment this factor has the value 5. As set forth in detail in DE-OS 30 27 071, herewith incorporated by reference, such a dimensioning of the transistors of the two pairs of the second differential amplifier 2 results in a smaller slope of the individual transfer function of this second differential amplifier 2 in relation to the non-linearised individual transfer function of the first differential amplifier 1. Moreover, owing to an appropriate dimensioning of the ratio between the areas of the second 16 or the third 18 current-source transistor and the first current-source transistor 5 and the corresponding dimensioning of the resistors 6, 17, 19, different emitter currents are fed into the pairs of emitter-coupled transistors of the first and the second differential amplifiers 1 and 2, which results in different limit values in the saturation ranges of the individual transfer functions of these differential amplifiers 1 and 2. In the particular dimensioning example shown in FIG. 1 the total current through the second differential amplifier 2 is selected to be larger than that through the first differential amplifier 1, so that larger limit values are obtained for the second differential amplifier 2 than for the first differential amplifier 1.

The current mirror 24 forms the difference between the currents in the collector terminals of the transistors 3, 13, 15 of the differential amplifiers 1, 2, which collector terminals are connected to the output terminal 22, and the currents in the collector terminals of the transistors 4, 12, 14, which collector terminals are connected to the first node 23, and supplies this difference to the output terminal 22. However, if the output of the circuit arrangement comprising the differential amplifiers 1, 2 is arranged as a two-pole push-pull output it is possible to replace the current mirror 24, for example, by two collector resistors connected to the supply voltage terminal 10. However, in the embodiment shown in FIG. 1 the voltage or current at the output terminal 22 forms an output signal which is directly available for further processing, for example, as a correction signal in a correction element.

The arrangement shown in FIG. 1 is preferably adapted to compensate for the cubic temperature-versus-resonant-frequency characteristic function of a quartz crystal, for which purpose the output terminal 22 is coupled to a varactor diode VD which serves as a correction element for the resonant frequency of the quartz crystal 62C. The output signal at the output terminal 22, i.e. a direct voltage or a direct current, serves to control the capacitance value of the varactor diode. This diode is, for example, arranged in parallel with said quartz crystal to influence the resonant frequency thereof.

The measuring element for generating a measurement signal, whose value is a measure of the temperature of the quartz crystal and which has at least a substantially linear dependence on this temperature, is a stage which is also shown in FIG. 1 and which is connected to the input terminals 20, 21 of the circuit arrangement formed by the differential amplifiers 1 and 2, which stage comprises two emitter-coupled measurement transistors 30 and 31, which in the embodiment shown in FIG. 1 are of a conductivity type opposite to that of the transistors of the differential amplifiers 1, 2. The collector terminals of the measurement transistors 30 and 31 are coupled to ground via collector resistors 32 and 33, respectively. The emitter terminals of the measurement transistors 30, 31 are commoned at a collector terminal of a fourth current-source transistor 34 of the same conductivity type as the measurement transistors 30, 31. The emitter terminal of the fourth current-source transistor is coupled to the supply voltage terminal 10 via a fourth resistor 35. The fourth current-source transistor 34 and the fourth resistor 35 are coupled to a second supply transistor 36 of the same conductivity type as the measurement transistors 30, 31 and the supply resistor 37 as a current mirror. For this purpose, the base terminals of the fourth current-source transistor 34 and of the second supply transistor 36 are connected to one another and to the collector terminal of the second supply transistor 36, and the emitter terminal of the second supply transistor 36 is coupled to the supply voltage terminal 10 via the second supply resistor 37. A second constant-current source 38 impresses a direct current upon the second supply transistor 36, which results in a direct current, which is in conformity with the dimensioning of the transistors 34, 36 and the resistors 35, 37, through the fourth current-source transistor 34 and hence through the measurement transistors 30 and 31.

A voltage divider comprises a fifth resistor 39, a fifth current-source transistor 40, a first divider resistor 41 and a second divider resistor 42, arranged in series in this sequence between the supply voltage terminal 10 and ground. The base terminal of the first measurement transistor 30 is connected to the node between the first and second divider resistors 41 and 42, and the base terminal of the second measurement transistor 31 is connected to the node between the first divider resistor 41 and the collector terminal of the fifth current-source transistor 40. Thus, the base terminals of the measurement transistors 30, 31 can receive a voltage which can be influenced by the current in the fifth current-source transistor 40 and which appears across the first divider resistor 41. The fifth resistor 39 and the fifth current-source transistor 40 are coupled to a third supply transistor 43 and a third supply resistor 44 as a current mirror, the base terminals of the fifth current-source transistor 40 and the third supply transistor 43 being connected to one another and to the collector terminal of the third supply transistor 43. The emitter terminal of the third supply transistor 43 is coupled to the supply voltage terminal 10 via the third supply resistor 44. A third constant-current source 45 has one side connected to the collector terminal of the third supply transistor 43 and the other side to ground. This constant-current source makes it possible to define the current in the third supply transistor 43 and hence in the fifth current-source transistor 40 and via thus the voltage between the base terminals of the measurement transistors 30, 31. The fifth current-source transistor 40 and the third supply transistor 43 are of the same conductivity type as the measurement transistors 30, 31.

The measurement transistors 30 and 31, which are also constructed as planar bipolar transistors, have differently dimensioned emitter areas scaled in a given ratio relative to one another. As a result of this, the division of the direct current applied via the fourth current-source transistor 34 between the two measurement transistors 30, 31 becomes temperature dependent. Consequently, the voltages produced across the collector resistors 32 and 33 by the currents in the collector terminals of the measurement transistors 30 and 31, respectively, also exhibit this temperature dependence. Thus, the input terminals 20, 21 of the circuit arrangement comprising the differential amplifiers 1, 2, which terminals are coupled to said collector resistors, receive a temperature-dependent difference voltage as the input signal.

Figure 2:
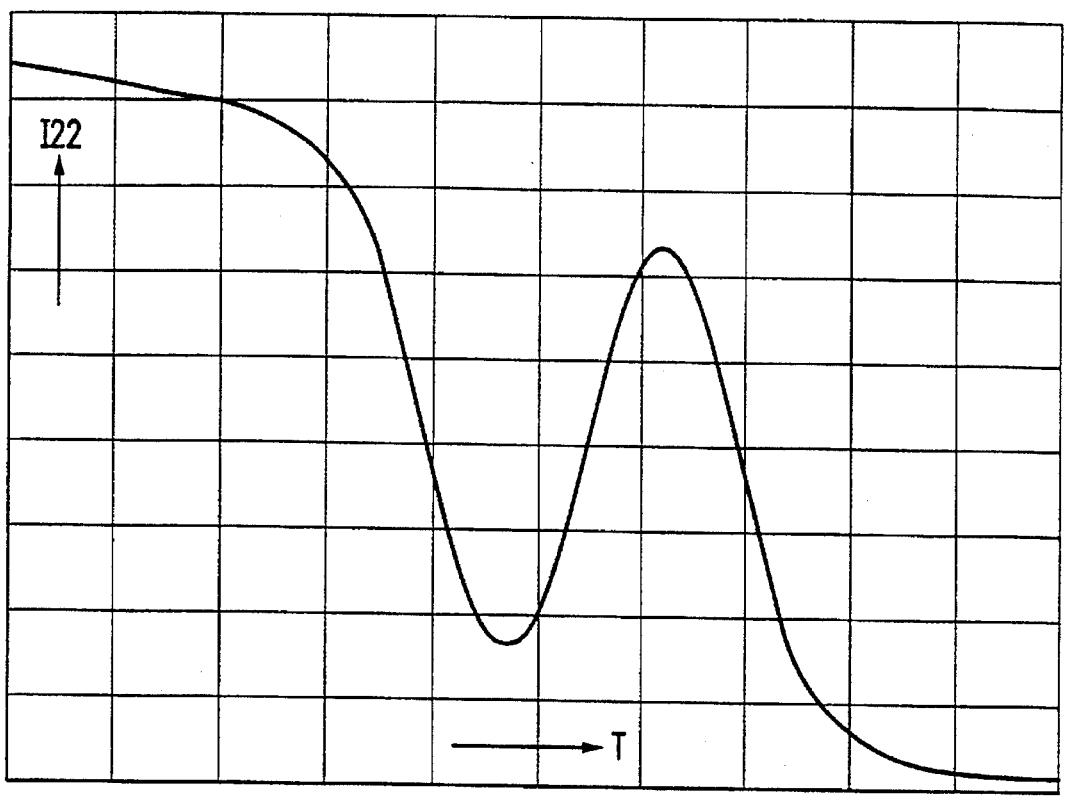
FIG. 2 is a diagram in which a current at the output of the arrangement shown in FIG. 1 is plotted versus the temperature.

The measuring element formed by the measurement transistors 30, 31 and the associated circuitry produces at the input terminals 20, 21 a measurement signal or input signal in the form of a voltage whose value has an at least substantially linear dependence on the temperature of the measurement transistors 30, 31. The circuit arrangement comprising the differential amplifiers 1, 2 derives from this voltage an output signal, which is at least substantially cubic at least partly, for example, an output current at the output terminal 22. In FIG. 2 an example of such a current I22 in the output terminal 22 is plotted on a linear scale as a function of the temperature T of the quartz crystal and hence of the measurement transistors 30, 31. This diagram shows in the central part an at least closely approximated third-degree function, i.e. a dependence of the current I22 on the third power of the temperature T.

It is directly apparent from FIG. 1 that the measuring element comprising the measurement transistors 30, 31 can be integrated directly on a semiconductor body together with the circuit arrangement comprising the differential amplifiers 1, 2 and can thus be very compact. However, it is alternatively possible to connect another, for example, external, measuring element to the input terminals 20, 21.

Different overall transfer functions can be obtained by an appropriate dimensioning of the circuit arrangement shown in FIG. 1, particularly of the current-source transistors 5, 16, 18 and of the first supply transistor 7 with its associated circuitry, and by the choice of the ratios between the emitter areas in the differential amplifiers 1 and 2, as a result of which the circuit arrangement can be adapted simply to different specifications of quartz crystals (or other elements to be compensated). If the constant-current sources, particularly the first constant-current source 11, can be controlled externally adjustment is even possible after finishing of the entire arrangement. Possible linear coefficients of the characteristic function whose temperature dependence is to be compensated can then be allowed for in that the currents supplied by the constant-current sources 11, 38 and 45 may also be given a linear temperature dependence, i.e. vary linearly with the temperature.

Figure 3:
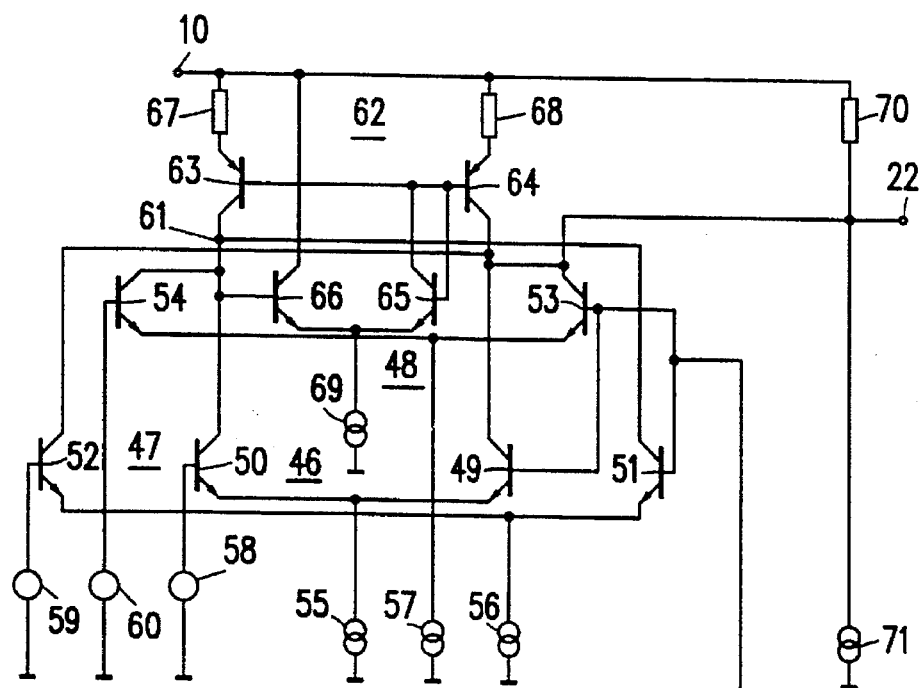
FIG. 3 shows a further embodiment of a circuit arrangement in accordance with the invention.

FIG. 3 shows a further embodiment of a circuit arrangement for generating an overall transfer function which at least in part is at least substantially of the third degree, which in FIG. 1 can take the place of the circuit arrangement comprising the differential amplifiers 1, 2 arranged between the input terminals 20, 21 and the output terminal 22. The measurement signal or the input signal is supplied from the measuring element to only one terminal, for which reason the circuit arrangement shown in FIG. 3 has only a first input terminal 20. For the remainder, elements in FIG. 3 which correspond to those in FIG. 1 bear the same reference symbols.

The circuit arrangement shown in FIG. 3 comprises three identical non-linearised differential amplifiers 46, 47 and 48, of which the third differential amplifier 46 comprises a pair of emitter-coupled transistors 49, 50, the fourth differential amplifier 47 comprises a pair of emitter-coupled transistors 51, 52 and the fifth differential amplifier 48 comprises a pair of emitter-coupled transistors 53, 54 and which each also comprise a current source 55, 56 and 57, respectively, which feeds the coupled emitter terminals. The three differential amplifiers 46, 47, 48 have individual transfer functions with at least substantially corresponding slopes in their linear ranges as well as substantially corresponding limit values in their saturation ranges. However, the zero points of the individual transfer functions are set to different values by means of three reference voltage sources, i.e. 58 for the third differential amplifier 46, 59 for the fourth differential amplifier 47, and 60 for the fifth differential amplifier 48. Preferably, the first reference voltage source 58 is dimensioned to supply a reference direct voltage of 1 V, the second reference voltage source 59 to supply a reference direct voltage of 1.1 V, and the third reference voltage source 60 to supply a reference direct voltage of 1.2 V. The current sources 55, 56, 57 may be of a construction corresponding to the arrangement comprising the current-source transistors 5, 16, 18, the resistors 6, 17, 19, the first supply transistor 7, the first supply resistor 8, the further transistor 9 and the first constant-current source 11, whereas the reference direct voltages may be derived from a common reference voltage divider which, for example, in the same way as the voltage divider arrangement in FIG. 1 may comprise the divider resistors 41, 42, the fifth resistor 39, the fifth current-source transistor 40, the third supply transistor 43, the third supply resistor 44, and the third constant-current source 45. However, for the sake of clarity this is not shown in detail in FIG. 3.

The base terminals of the first transistors 49, 51, 53 of the third, the fourth and the fifth differential amplifier 46, 47 and 48, respectively, are together connected to the input terminal 20 and are thus driven in common by the input or measurement signal, while the second transistors 50, 52, 54 have their base terminals connected to the first, the second and the third reference voltage source 58, 59 and 60, respectively. The collector terminals of the first transistor 49 of the third differential amplifier 46, of the second transistor 52 of the fourth differential amplifier 47 and of the first transistor 53 of the fifth differential amplifier 48 are together connected to the output terminal 22, while the collector terminals of the second transistor 50 of the third differential amplifier 46, of the first transistor 51 of the fourth differential amplifier 47 and of the second transistor 54 of the fifth differential amplifier 48 are connected to a common node 61. By means of these connections of the collector terminals it is achieved that the individual transfer functions of the three differential amplifiers 46, 47, 48 are added alternately with positive and with negative signs in the sequence of the zero points in order to obtain the overall transfer function. The individual transfer functions of the third and fifth differential amplifiers 46 and 48 therefore contribute to the overall transfer function with the same sign and the individual transfer function of the differential amplifier 47 with the opposite sign.

In the circuit arrangement shown in FIG. 3 the node 61 and the output terminal 22 are coupled, in the same way as in FIG. 1, via a second current mirror 62, which forms the difference of the sum currents in the respective collector terminals connected to the node 61 and the output terminal 22, in order to provide an asymmetrical single-ended output voltage (output signal). For this purpose, the second current mirror 62 comprises a third current-mirror transistor 63, whose collector terminal is connected to the node 61 and whose emitter terminal is coupled to the supply voltage terminal 10 via a fourth current-mirror resistor 67. The base terminals of a fourth and a fifth current-mirror transistor 64 and 65, respectively, and the collector terminal of the fifth current-mirror transistor 65 are connected to the base terminal of the third current-mirror transistor 63. The collector terminal of the fourth current-mirror transistor 64 is connected to the output terminal 22, its emitter terminal being coupled to the supply voltage terminal 10 via a fifth current-mirror resistor 68. A sixth current-mirror transistor 66 has its collector terminal also connected to the supply voltage terminal 10, its base terminal to the node 61 and its emitter terminal to the emitter terminal of the fifth current-mirror transistor 65 and to an emitter-current source 69, whose other side is connected to ground, as a differential amplifier.

An output resistor 70 is arranged between the supply voltage terminal 10 and the output terminal 22 for the conversion of the output current (supplied by the second current mirror 62 as a difference current) available at the output terminal 22 of the circuit arrangement shown in FIG. 3. The output current produces across this output resistor 70 an output voltage which can be processed directly as a control signal for a correction element. A third constant-current source 71 arranged between the output terminal 22 and ground serves for setting the operating point.

Figure 4:
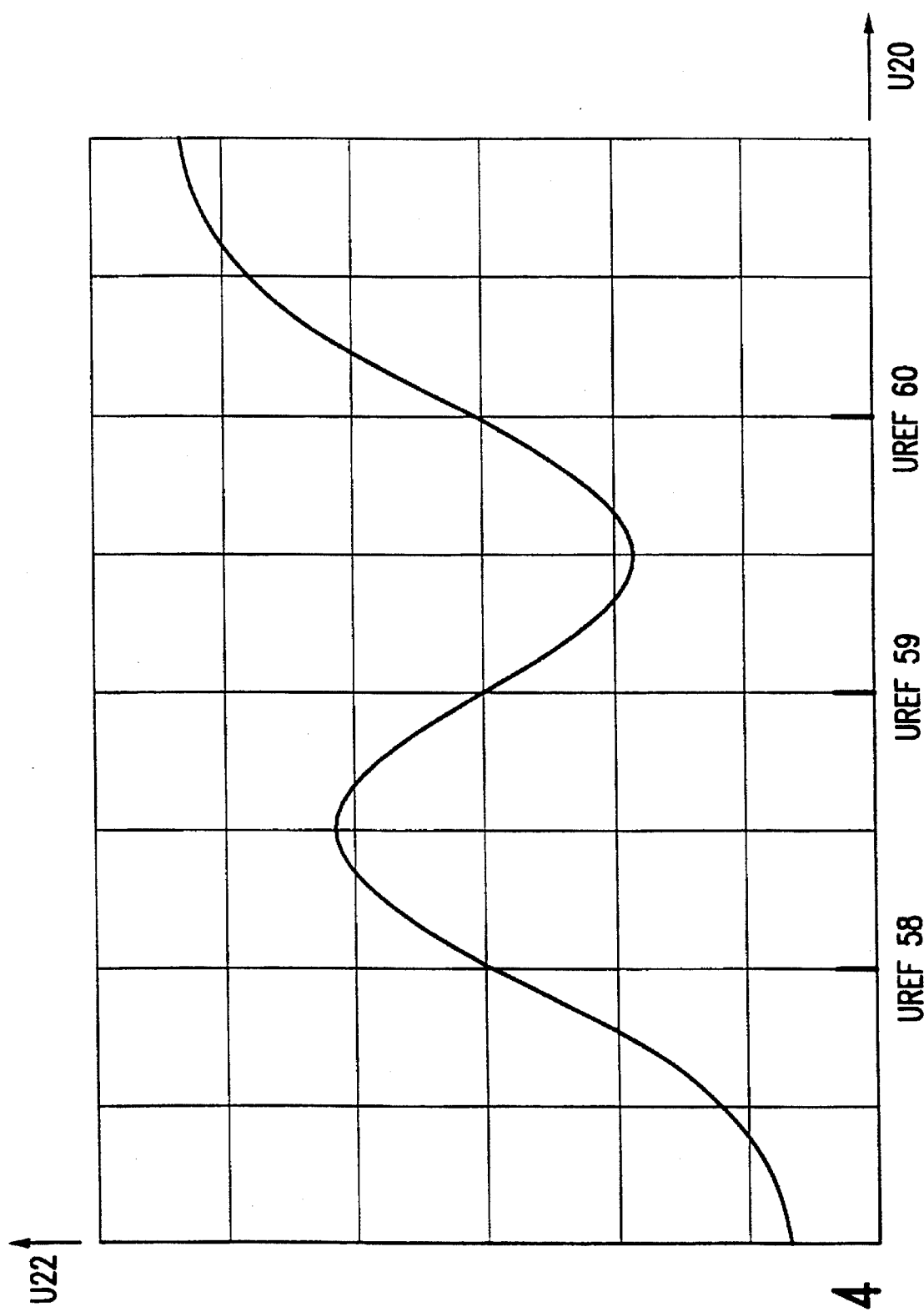
FIG. 4 shows the overall transfer function of the circuit arrangement shown in FIG. 3.

FIG. 4 shows an example of an overall transfer function between a voltage U20, which can be applied as an input signal to the input terminal 20, and a voltage U22, which is available as an output signal at the output terminal 22, which function can be realised by means of the circuit arrangement shown in FIG. 3. This diagram also shows the reference direct voltages UREF58, UREF59 and UREF60 supplied by the reference voltage sources 58, 59 and 60, respectively. In the dimensioning example given above these voltages are 1.0 V, 1.1 V and 1.2 V, respectively. The diagram in FIG. 4 clearly shows the substantially cubic overall transfer function in the proximity of these reference direct voltages.

Figure 5:
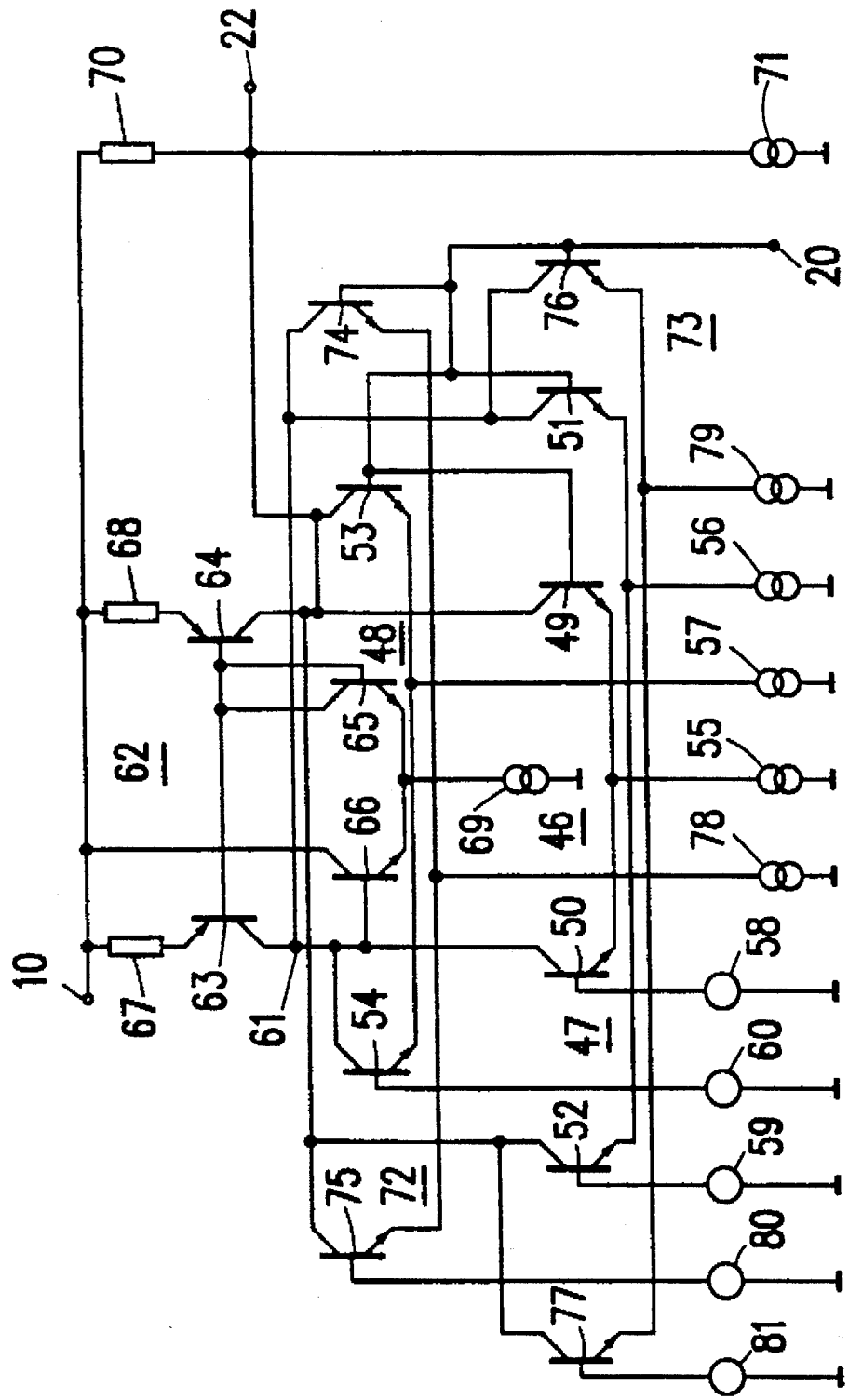
FIG. 5 shows a third embodiment of the circuit arrangement in accordance with the invention.

A variant of the embodiment shown in FIG. 3 is shown in FIG. 5, in which like elements again bear the same reference symbols and in which the circuit arrangement shown in FIG. 3 is extended by a sixth and a seventh differential amplifier 72, 73 with associated circuitry. Preferably, the sixth and the seventh differential amplifier 72, 73 are not linearised and are at least substantially similar in construction to the third, the fourth and the fifth differential amplifier 46, 47 and 48, respectively. The sixth differential amplifier 72 thus comprises a pair of emitter-coupled transistors 74, 75 and the seventh differential amplifier 73 comprises a pair of emitter-coupled transistors 76, 77. The interconnected emitter terminals of the transistors 74, 75 of the sixth differential amplifier 72 are coupled to ground via a current source 78 and the interconnected emitter terminals of the transistors 76, 77 of the seventh differential amplifier 73 via a current source 79. The base terminal of the second transistor 75 of the sixth differential amplifier 72 is coupled to ground via a fourth reference voltage source 80 and the base terminal of the second transistor 77 of the seventh differential amplifier 73 via a fifth reference voltage source 81. The current sources 78, 79 of the sixth and the seventh differential amplifier 72 and 73, respectively, are preferably similar in construction to the current sources 55 to 57 of the third to the fifth differential amplifier 46 to 48. However, the fourth reference voltage source 80 of the sixth differential amplifier 72 is adapted to supply a reference direct voltage UREF80, which in the example shown in FIG. 5 is lower than the reference direct voltage UREF58 of the first reference voltage source 58, and the fifth reference voltage source 81 of the seventh differential amplifier 73 is adapted to supply a reference direct voltage UREF81 higher than the reference direct voltage UREF60 of the third reference voltage source 60. Preferably, UREF80 is 0.9 V and UREF81 is 1.3 V. The collector terminals of the first transistors 74, 76 of the sixth and the seventh differential amplifiers 72, 73 are connected to the node 61 and the collector terminals of the second transistors 75, 77 of the sixth and the seventh differential amplifier 72, 73 are connected to the output terminal 22.

Figure 6:
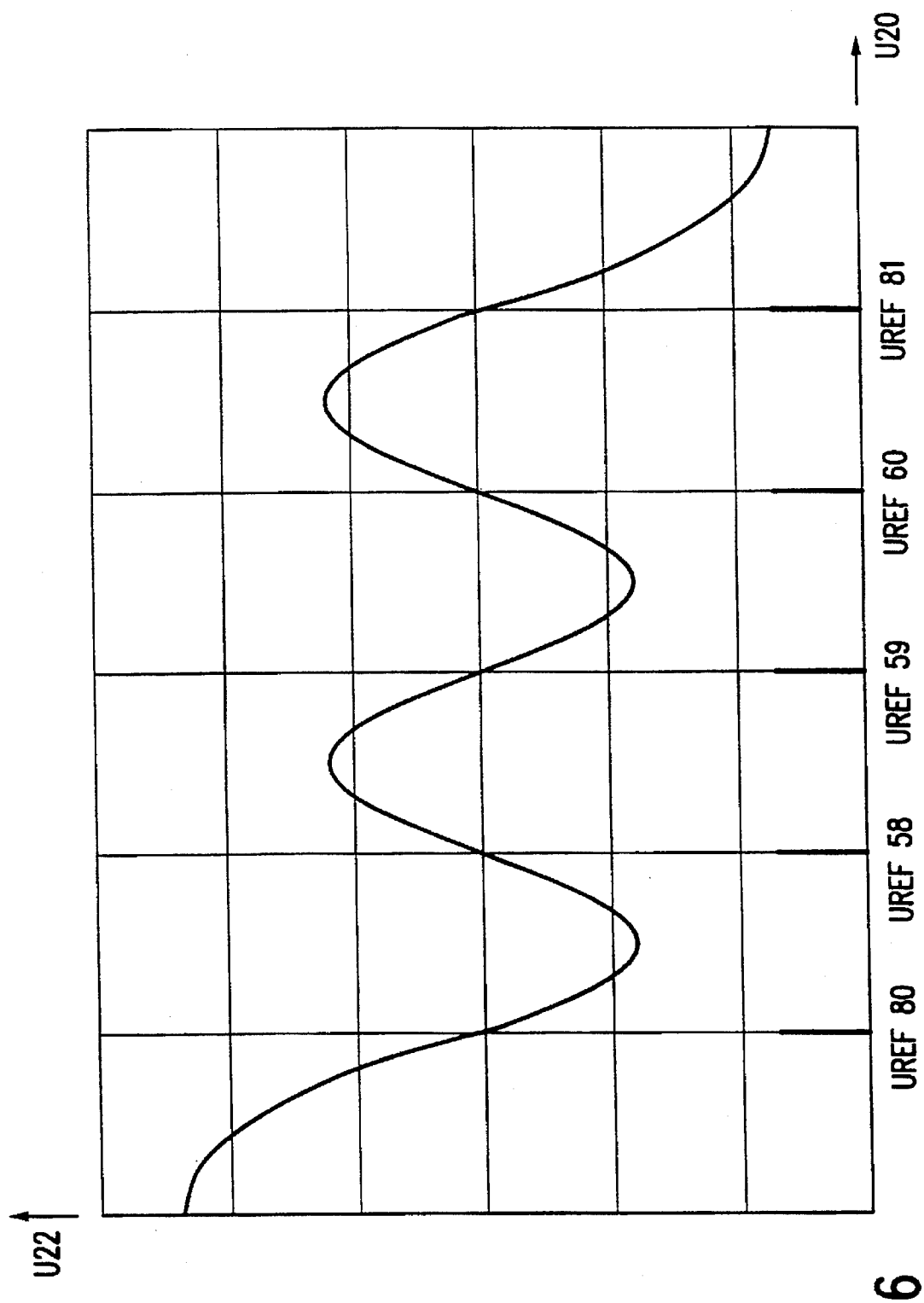
FIG. 6 shows the overall transfer function of the circuit arrangement shown in FIG. 5.

With the described design the circuit arrangement shown in FIG. 5 will provide the overall transfer function, shown in FIG. 6, between the voltage U20 at the input terminal 20 (Input signal) and the voltage U22 at the output terminal 22 (output signal). In the proximity of the reference direct voltages UREF58 to UREF60 the overall transfer function in FIG. 6 will correspond to that in FIG. 4. Towards larger voltage values of the input signal U20 this known part of the curve is adjoined by a further maximum between the reference direct voltages UREF60 and UREF81, and likewise a further minimum is obtained between the reference direct voltages UREF80 and UREF58 towards lower values of the input signal U20. The individual transfer functions of the sixth and the seventh differential amplifier 72 and 73, added in comparison with FIG. 4, are added to the overall transfer function with the same sign as the individual transfer function of the fourth differential amplifier 47 in accordance with the sequence of the associated reference direct voltages UREF80 and UREF81. Thus, the overall transfer function shown in FIG. 6 comprises five individual transfer functions combined with a sign which changes alternately in the sequence from the lowest reference direct voltage UREF80 to the highest reference direct voltage . UREF81. All of the individual transfer functions then have corresponding slopes in their linear ranges and corresponding limit values in their saturation ranges and are merely shifted relative to one another with respect to their zero points in accordance with the reference direct voltages, so that the function shown in FIG. 6 is at least an approximate fifth-degree function in the range of the reference direct voltages UREF80 to UREF81.

In a variant of the circuit arrangement shown in FIG. 5 the connections of the sixth and the seventh differential amplifier 72, 73 and their reference voltage sources 80, 81 may be arranged in such a manner such that, for example, in comparison with FIG. 4 both the additional maximum and the additional minimum of the overall transfer function in FIG. 6 occur above the reference direct voltage UREF60 of the third reference voltage source 60 or below the reference direct voltage UREF58 of the first reference voltage source 58. Likewise, additional minima or maxima can be introduced by means of further differential amplifiers, so that it is also simple to generate further overall transfer functions of correspondingly higher degree.

I claim:

1. A circuit arrangement comprising:
    an input arranged to receive an input signal (U20),
    an output for providing an output signal (U22),
    said circuit having an overall transfer function defined as the ratio between the output signal (U22) and the input signal (U20) and obtained by adding individual transfer functions of at least two differential amplifiers with different slopes in their linear ranges and/or different limit values in their saturation ranges and/or different zero points, said individual transfer functions being added alternately with positive and negative signs in a manner such that, at least a part of said overall transfer function corresponds at least substantially to a function of at least the third degree.

2. A circuit arrangement as claimed in claim 1,
    wherein the overall transfer function is formed by said addition of individual transfer functions of said at least two differential amplifiers with different slopes in their linear ranges and with limit values in their saturation ranges, wherein said limit values increase monotonically in the sequence of decreasing slopes, and the individual transfer functions are added alternately with positive and negative signs in the same sequence.

3. A circuit arrangement as claimed in claim 1,
    wherein the overall transfer function is formed by said addition of individual transfer functions of at least three differential amplifiers with different zero points, and the individual transfer functions are added with alternating positive and negative signs in the sequence of the zero points.

4. A circuit arrangement as claimed in claim 3, in which at least a part of the overall transfer function is a function of at least the third degree,
in combination with,
    a quartz crystal having, in a relevant temperature range, a temperature-versus-resonant-frequency characteristic function of at least substantially the third degree,
    a correction element for correcting the resonant frequency by a correction signal with an at least substantially linear transfer characteristic between the correction signal and the resonant frequency, and
    a measuring apparatus for deriving a measurement signal having an at least substantially linear dependence on the temperature of the quartz crystal,
means for applying the measurement signal to the circuit arrangement as said input signal, wherein the circuit arrangement applies the output signal, derived from said input signal in accordance with the overall transfer function, to the correction element as the correction signal in a manner such that the resonant frequency of the quartz crystal, coupled to the correction element, is at least substantially temperature independent in said range.

5. A circuit arrangement as claimed in claim 1,
    wherein the differential amplifiers each comprise a transistor pair whose emitter terminals are coupled to at least one respective emitter resistor, the slopes of the individual transfer functions of the differential amplifiers in their linear ranges being adjustable by an appropriate choice of the resistance values of the respective emitter resistors.

6. A circuit arrangement as claimed in claim 1 wherein at least one of the differential amplifiers comprise a first and a second pair of first and second emitter-coupled bipolar planar transistors, a base and a collector terminal of the first transistor of the first pair being coupled to a corresponding base and collector terminal of the first transistor of the second pair and a base and a collector terminal of the second transistor of the first pair being coupled to a corresponding base and collector terminal of the second transistor of the second pair, and the emitter areas of the second transistor of the first pair and the first transistor of the second pair being equal to one another and being a given factor larger or smaller than the mutually equal emitter areas of the two other transistors of the first and second pairs of transistors transistors.

7. A circuit arrangement as claimed in claim 2, in which the at least a part of the overall transfer function is a function of at least the third degree,
    in combination with, a quartz crystal having a temperature-versus-resonant-frequency characteristic function of at least the third degree in a relevant temperature range,
    a correction element for correcting the resonant frequency by a correction signal with an at least substantially linear transfer characteristic between the correction signal and the resonant frequency, and a measuring means for deriving a measurement signal having an at least substantially linear dependence on the temperature of the quartz crystal,
means for applying the measurement signal to the input of the circuit arrangement as the input signal, wherein the circuit arrangement applies the output signal, derived from said input signal in accordance with the overall transfer function, to the correction element as the correction signal in a manner such that the resonant frequency of the quartz crystal, coupled to the correction element, is at least substantially temperature independent in said range.

8. A circuit arrangement as claimed in claim 7 wherein the differential amplifiers each comprise a transistor pair whose emitter terminals are coupled in common to at least one respective emitter resistor, the slopes of the individual transfer functions of the differential amplifiers in their linear ranges being adjustable by an appropriate choice of the resistance values of the respective emitter resistors.

9. A circuit arrangement as claimed in claim 7 wherein one of the differential amplifiers comprises a first and a second pair of first and second emitter-coupled bipolar planar transistors, a base and a collector terminal of the first transistor of the first pair being coupled to a corresponding base and collector terminal of the first transistor of the second pair and a base and a collector terminal of the second transistor of the first pair being coupled to a corresponding base and collector terminal of the second transistor of the second pair, and the emitter areas of the second transistor of the first pair and the first transistor of the second pair being equal to one another and being a given factor larger or smaller than the mutually equal emitter areas of the first transistor of the first pair and the second transistor of the second pair.

10. A circuit arrangement as claimed in claim 1, in which the at least a part of the overall transfer function is a function of at least the third degree, in combination with, a quartz crystal having a temperature-versus-resonant-frequency characteristic function of at least the third degree in a relevant temperature range, a correction element for correcting the resonant frequency by a correction signal with an at least substantially linear transfer characteristic between the correction signal and the resonant frequency, and a measuring means for deriving a measurement signal having an at least substantially linear dependence on the temperature of the quartz crystal, means for applying the measurement signal to the input of the circuit arrangement as the input signal, wherein the circuit arrangement applies the output signal, derived from said input signal in accordance with the overall transfer function, to the correction element as the correction signal in a manner such that the resonant frequency of the quartz crystal coupled to the correction element, is at least substantially temperature independent in said range.

11. A circuit arrangement as claimed in claim 2, wherein the differential amplifiers each comprise a transistor pair whose emitter terminals are coupled to at least one respective emitter resistor, the slopes of the individual transfer functions of the differential amplifiers in their linear ranges being adjustable by an appropriate choice of the resistance values of the respective emitter resistors.

12. A circuit arrangement as claimed in claim 2 wherein one of the differential amplifiers comprises a first and a second pair of first and second emitter-coupled bipolar planar transistors, a base and a collector terminal of the first transistor of the first pair being coupled to a corresponding base and collector terminal of the first transistor of the second pair and a base and a collector terminal of the second transistor of the first pair being coupled to a corresponding base and collector terminal of the second transistor of the second pair, and the emitter areas of the second transistor of the first pair and the first transistor of the second pair being equal to one another and being a given factor different from the mutually equal emitter areas of the two other transistors of the first and second pairs of transistors.

13. The circuit arrangement as claimed in claim 1 wherein a first differential amplifier of said at least two differential amplifiers comprises a non-linearized differential amplifier and a second differential amplifier of said at least two differential amplifiers comprises a linearized differential amplifier.

14. The circuit arrangement as claimed in claim 13 wherein the first differential amplifier, in the linear range of its individual transfer function, has a greater slope than that of the second differential amplifier in the linear range of its individual transfer function, the individual transfer function of the second differential amplifier has two higher limit values in its saturation ranges than the limit value of the individual transfer function of the first differential amplifier, and the first and second differential amplifiers have corresponding zero points.

15. The circuit arrangement as claimed in claim 1 wherein the two differential amplifiers are coupled together so that their individual transfer functions are added to provide said overall transfer function and said two differential amplifiers have individual transfer functions with different slopes in their linear ranges and different limit values in their saturation ranges.

16. The circuit arrangement as claimed in claim 1 wherein a first differential amplifier of said at least two differential amplifiers comprises a non-linearized differential amplifier including a first pair of first and second transistors coupled in common to a first current source, a second differential amplifier of said at least two differential amplifiers comprises a linearized differential amplifier including second and third pairs of third and fourth transistors and fifth and sixth transistors, respectively, with said second and third pairs of transistors coupled in common to respective second and third current sources, wherein emitter areas of the transistors of the second differential amplifier are chosen such that the slope of the individual transfer function of the second differential amplifier in its linear range is lower than the slope of the individual transfer function of the first differential amplifier in its linear range, and the respective currents supplied by said current sources determine the limit values in the saturation ranges of the individual transfer functions of the first and second differential amplifiers.

17. The circuit arrangement as claimed in claim 16 wherein the second and third current sources supply a total current to the second differential amplifier that is larger than the current supplied by the first current source to the first differential amplifier whereby the limit values of the second differential amplifier are greater than the limit values of the first differential amplifier.

18. The circuit arrangement as claimed in claim 1, wherein the at least two diferential amplifiers of the circuit further comprise first, second and third non-linearized differential amplifiers which are coupled together so that the individual transfer functions thereof are added alternately with positive and with negative signs in the sequence of the zero points, wherein said first through third differential amplifiers are arranged so that they have individual transfer functions with substantially corresponding slopes in their linear ranges and substantially corresponding limit values in their respective saturation ranges, but with different zero points, and said output is coupled to at least one of said first through third differential amplifiers to provide the part of the overall transfer function of the third degree at said output.

19. The circuit arrangement as claimed in claim 18 wherein said first, second and third differential amplifiers each comprises a pair of first and second transistors, first means for coupling a collector of the first transistor of each pair of first and second transistors of the first, second and third differential amplifiers to a common node, second means for coupling a collector of the second transistor of each pair of first and second transistors of the first, second and third differential amplifiers to said output, and a current mirror coupled to said common node and to said output so as to form a difference of the currents in the respective collector terminals coupled to the common node and the output thereby to derive at said output the output signal as an asymmetrical single ended output signal.

20. An integrated circuit comprising:

an input arranged to receive an input signal, first and second differential amplifiers coupled together so that their individual transfer functions are added together with alternating positive and negative signs so as to produce an overall transfer function of the circuit of at least the third degree when the input signal is received by the differential amplifiers, wherein the individual transfer functions of the first and second differential amplifiers are determined by at least one of the following parameters, the slopes in their linear ranges, the limit values in their saturation ranges, and the zero points thereof, at least one of said parameters being different for the first and second differential amplifiers, and means for coupling an output terminal to at least one of said differential amplifiers thereby to provide an output signal with said overall transfer function of at least the third degree.

21. The integrated circuit as claimed in claim 20 further comprising:

means for coupling said output terminal to a quartz crystal having a temperature-dependent resonant frequency characteristic of the third degree and to a correction element for correcting the quartz crystal resonant frequency via a correction signal having a linear transfer characteristic between the correction signal and the resonant frequency, means for deriving a measurement signal having a linear dependence on the quartz crystal temperature, and means for applying said measurement signal to the input of the integrated circuit as said input signal whereby the quartz crystal resonant frequency is substantially independent of temperature over a given temperature range.

22. The integrated circuit as claimed in claim 21 wherein the measurement signal deriving means comprises:

a constant current source coupled to a first branch of a current mirror having further branches coupled to said first and second differential amplifiers, and a further differential amplifier for deriving the measurement signal.

* * * * *